(12) United States Patent
Bradfield et al.

(10) Patent No.: US 6,922,817 B2
(45) Date of Patent: Jul. 26, 2005

(54) SYSTEM AND METHOD FOR ACHIEVING TIMING CLOSURE IN FIXED PLACED DESIGNS AFTER IMPLEMENTING LOGIC CHANGES

(75) Inventors: Travis Alister Bradfield, Colorado Springs, CO (US); Tracy Robert Spitler, Colorado Springs, CO (US); Gregory A. Johnson, Colorado Springs, CO (US); Matthew Richard Motiff, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 159 days.

(21) Appl. No.: 10/408,205

(22) Filed: Apr. 4, 2003

(65) Prior Publication Data

US 2004/0199879 A1 Oct. 7, 2004

(51) Int. Cl.[7] .................. G06F 17/50; G06F 9/45
(52) U.S. Cl. ............. 716/1; 716/6; 716/9; 716/10
(58) Field of Search .................. 716/1, 6, 9, 10, 716/18

(56) References Cited

U.S. PATENT DOCUMENTS

| | | | | | |
|---|---|---|---|---|---|
| 5,696,943 A | * | 12/1997 | Lee | ............................ | 716/4 |
| 5,724,250 A | * | 3/1998 | Kerzman et al. | ............... | 716/3 |
| 5,872,717 A | * | 2/1999 | Yu et al. | .......................... | 716/6 |
| 6,209,121 B1 | * | 3/2001 | Goto | .............................. | 716/6 |
| 6,255,845 B1 | * | 7/2001 | Wong et al. | .................. | 326/38 |
| 6,260,177 B1 | * | 7/2001 | Lee et al. | ....................... | 716/2 |
| 6,272,668 B1 | * | 8/2001 | Teene | .......................... | 716/10 |
| 6,321,371 B1 | * | 11/2001 | Yount, Jr. | ..................... | 716/17 |
| 6,427,226 B1 | * | 7/2002 | Mallick et al. | ............... | 716/10 |
| 6,446,248 B1 | * | 9/2002 | Solomon et al. | ............. | 716/17 |
| 6,453,454 B1 | * | 9/2002 | Lee et al. | ..................... | 716/11 |
| 6,480,990 B1 | * | 11/2002 | Sharp et al. | ................... | 716/8 |
| 6,601,228 B1 | * | 7/2003 | LaBerge | ....................... | 716/16 |
| 2002/0108095 A1 | * | 8/2002 | Barney et al. | ................ | 716/10 |
| 2002/0120910 A1 | * | 8/2002 | Giaume et al. | ................ | 716/6 |
| 2002/0184607 A1 | * | 12/2002 | Alpert et al. | ................. | 716/15 |
| 2003/0233625 A1 | * | 12/2003 | Brazell et al. | ................ | 716/8 |

\* cited by examiner

Primary Examiner—Vuthe Siek
Assistant Examiner—Magid Y. Dimyan
(74) Attorney, Agent, or Firm—Yee & Associates, P.C.

(57) ABSTRACT

A system and method for implementing logic changes in integrated circuits (ICs). In a preferred embodiment, donor logic elements are taken from donator logic paths. The donated cells are implemented into a logic path altered by an ECO. The donated cell is replaced by spare cells. Timing analysis is done to ensure all logic paths are timing closed.

18 Claims, 5 Drawing Sheets

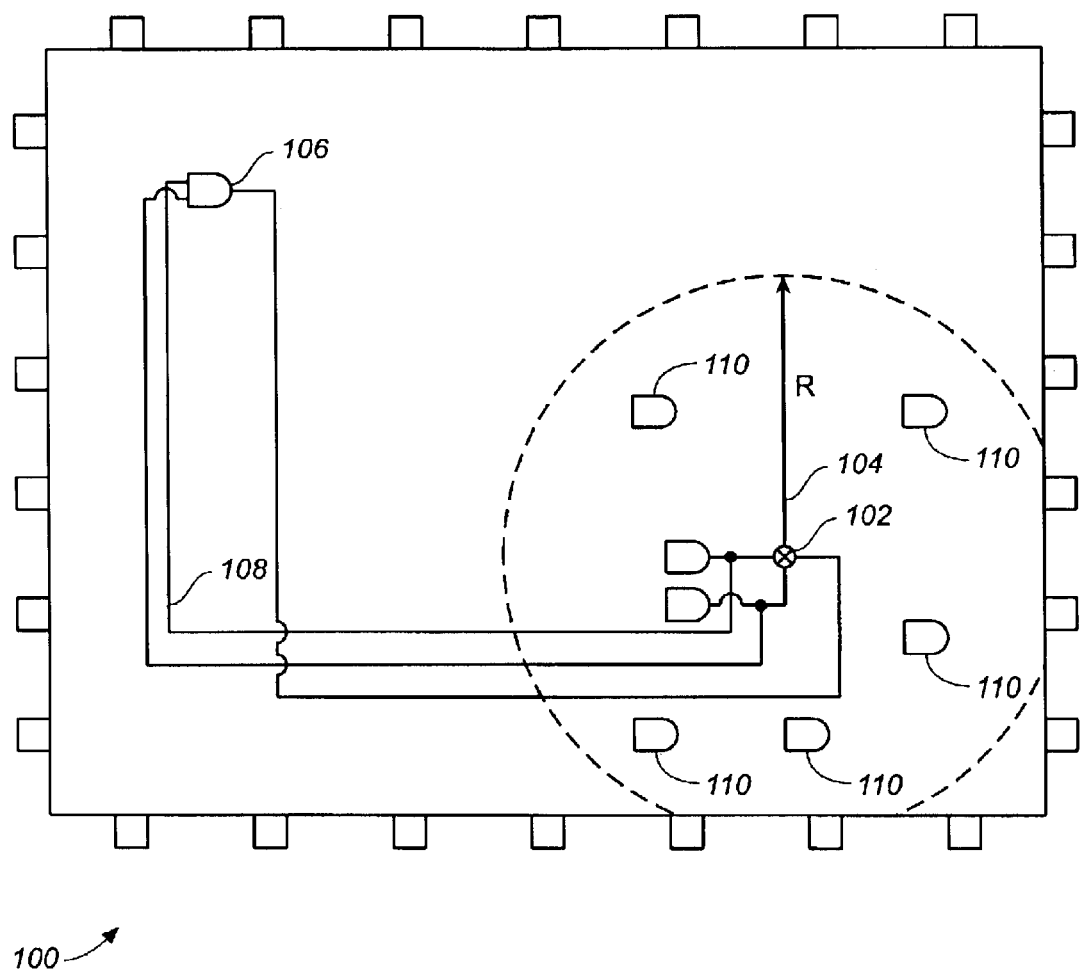
FIG._1

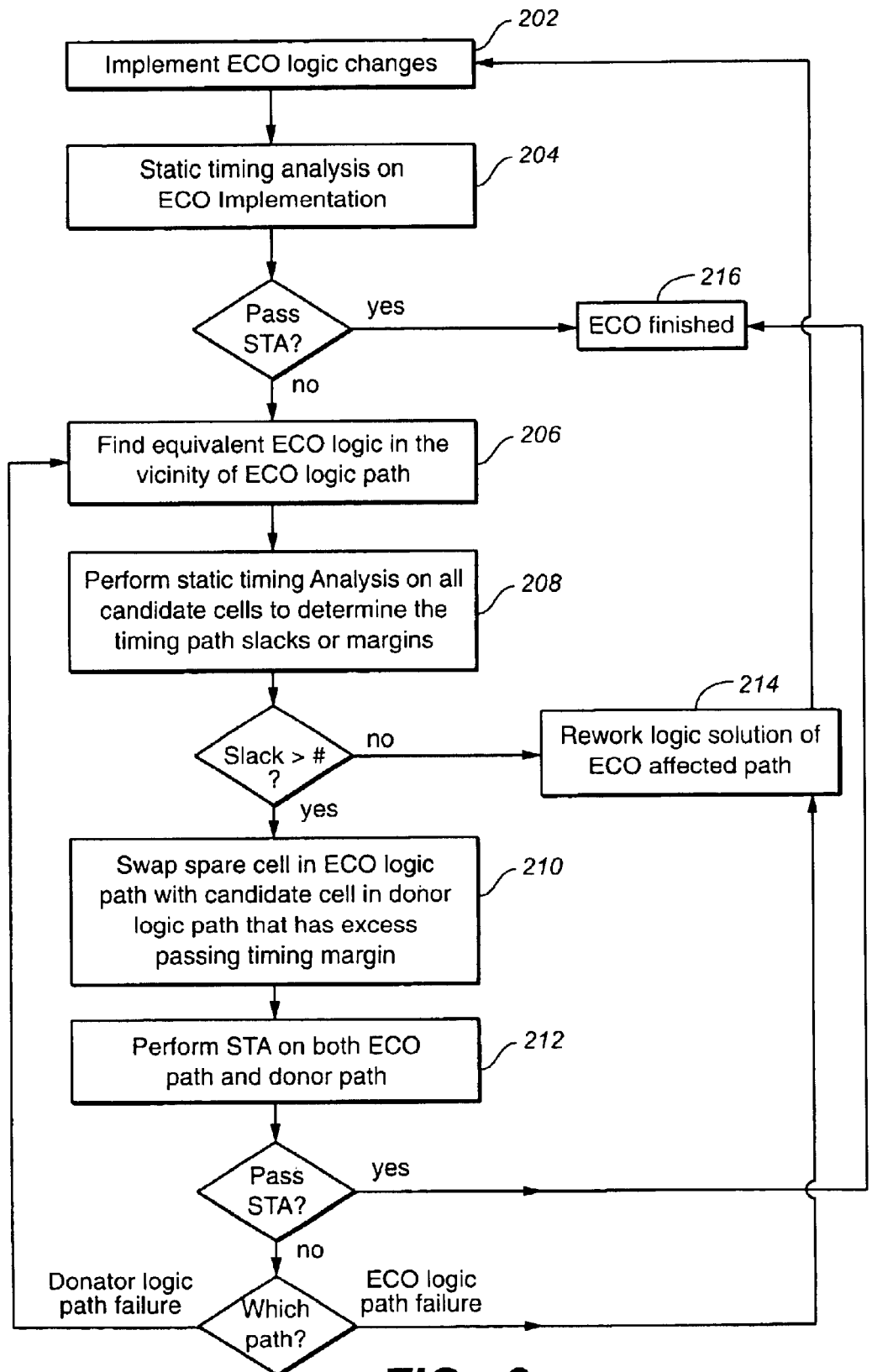
FIG._2

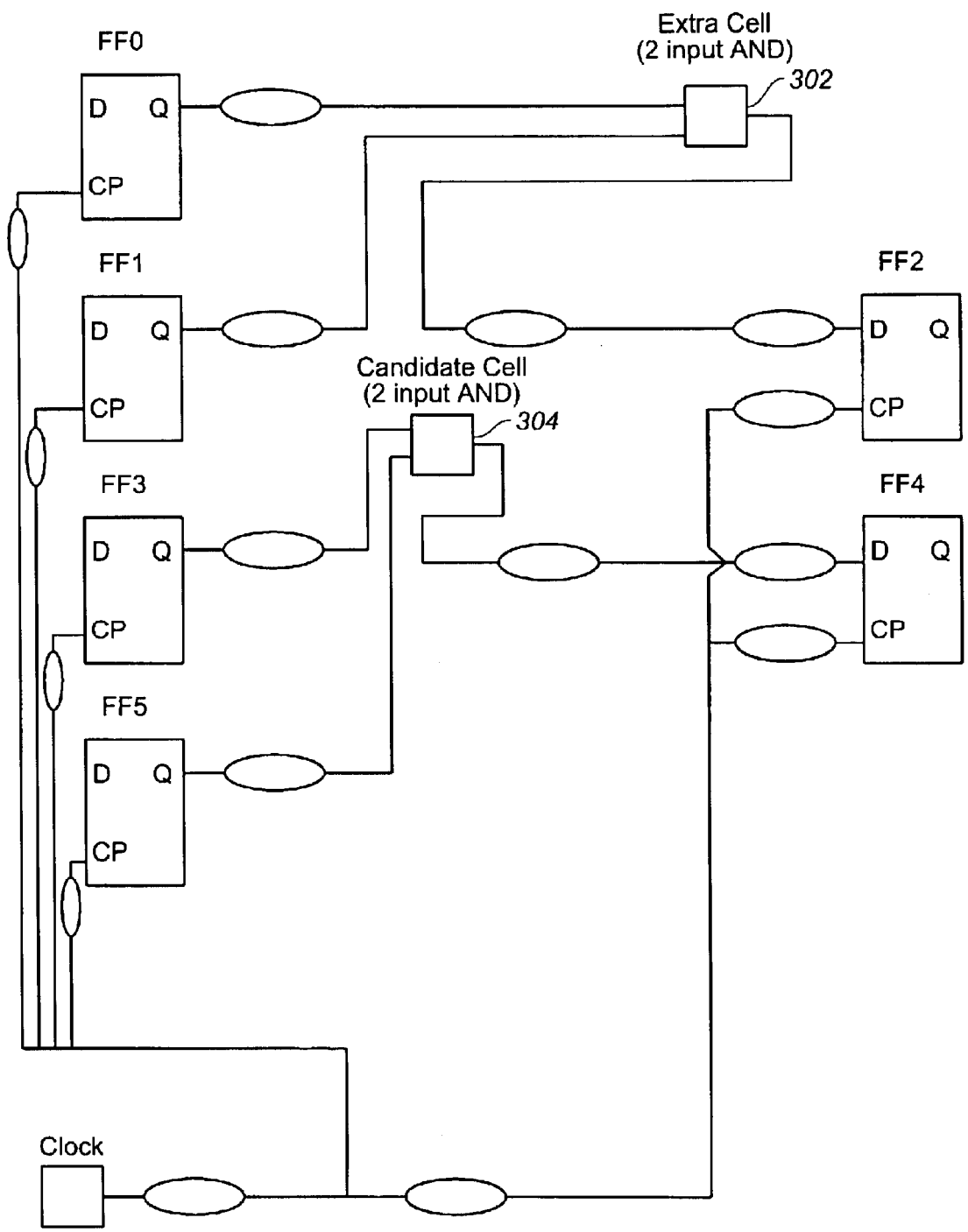
FIG._3

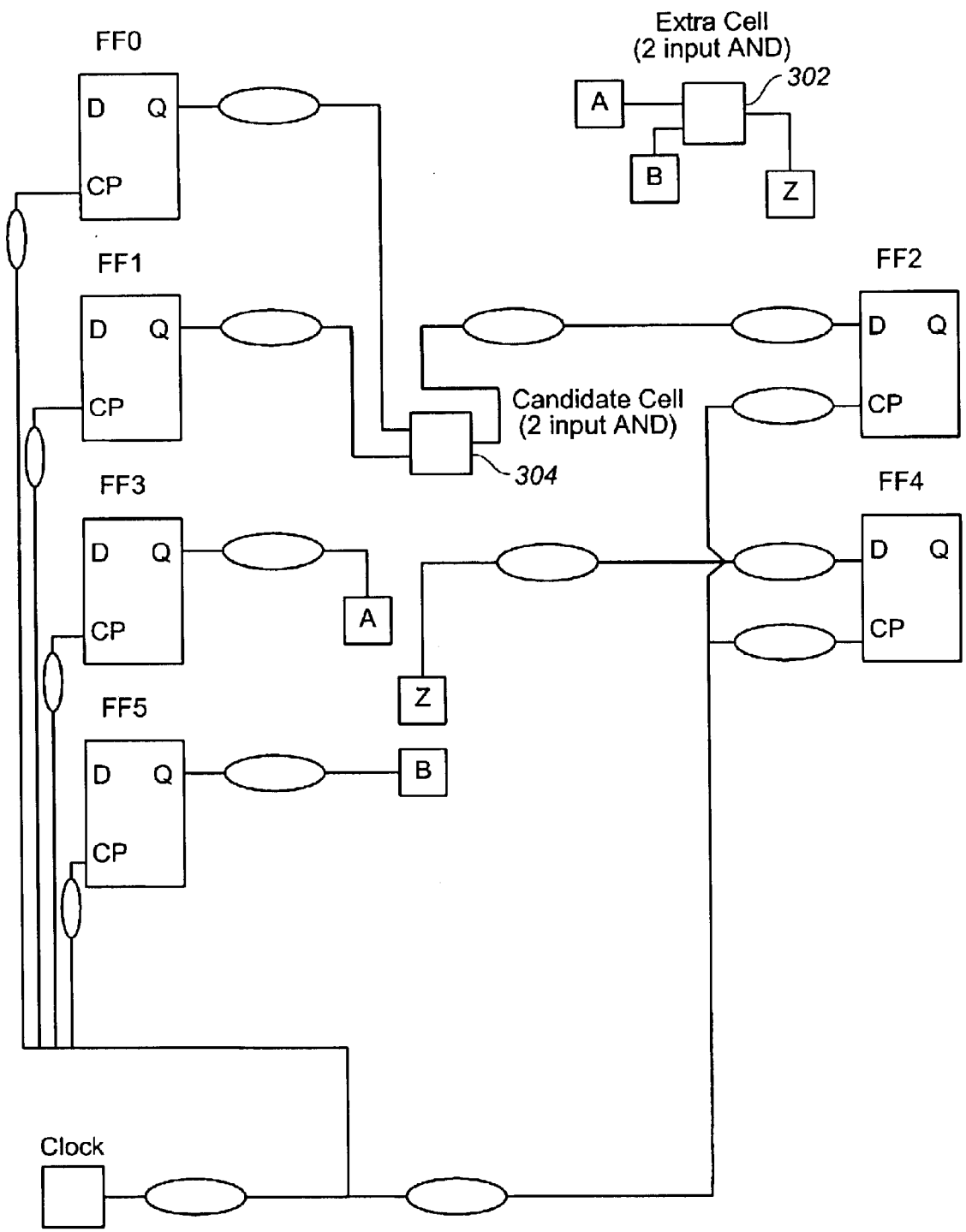
FIG._4

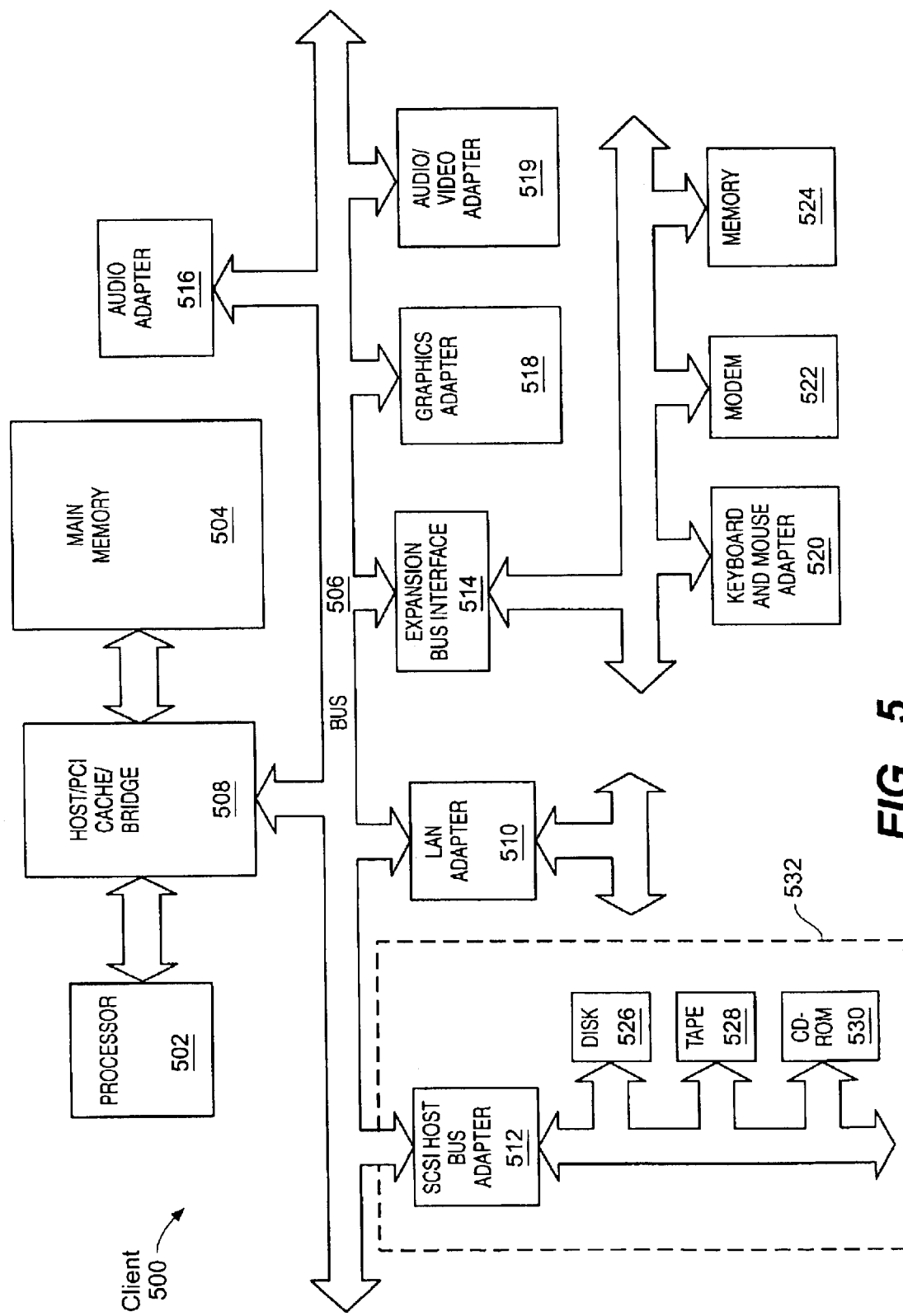
FIG._5

US 6,922,817 B2

SYSTEM AND METHOD FOR ACHIEVING TIMING CLOSURE IN FIXED PLACED DESIGNS AFTER IMPLEMENTING LOGIC CHANGES

BACKGROUND OF THE INVENTION

1. Technical Field

The present invention generally relates to logic changes in integrated circuit design, and more specifically to maintaining proper timing closure when such changes are made.

2. Description of Related Art

Timing closure of logic designs becomes more challenging as circuit elements decrease in size and increase in speed. When logic changes are made (e.g., an element is added) in an engineering change order (ECO), extra or spare cells, already existing in the design, are typically used. Extra or spare cells are defined as any logic element intentionally placed by the designer for the use of future ECOs or cells freed up for use after a previous ECO logic change.

In many cases, the extra logic that is intentionally placed by the designer in previous revisions of silicon (e.g., during full layer spins) is not in an ideal location with respect to timing closure. Spare elements are therefore more cheaply connected to the desired logic path by creating interconnects between them, which can be done in a metal-only spin—a cheaper process than a full layer spin. Typically, existing extra logic cells or elements are placed in any spare area of the silicon, which may be distant from the desired location for the added element. The timing delay introduced by routing to the extra cell logic element is detrimental and can cause timing closure failure.

There are often other logic paths nearby the preferred location for the new element. Often, these nearby logic paths have enough leeway in their timing closure to endure added delay while still maintaining timing closure. However, this timing leeway of nearby logic paths is not currently taken advantage of when implementing ECOs.

Hence, there is a need in the art for a system and method of achieving timing closure for logic changes that avoids these problems.

SUMMARY OF THE INVENTION

The present invention is directed to the use of logic cells donated by donator logic paths in the design. In one example embodiment, an ECO requires the alteration of an existing first logic path. Nearby logic paths are considered potential donor logic paths, and logic elements in those nearby paths are identified. Excess timing slack is identified in those paths, and they are tested to find a path capable of donating an element to the first logic path. The donated cell is replaced in the donor path with an existing or spare cell from elsewhere on the chip. Timing analysis is performed at various points to ensure that all logic paths are timing closed.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 shows a diagram of an ideal location for added logic placement relative to candidate cells within a given area and spare cells.

FIG. 2 shows a flow chart implementing the present innovations consistent with a preferred embodiment.

FIG. 3 illustrates the initial placement of the ECO extra cell and the candidate cell from the donor logic path.

FIG. 4 shows the exchange of the ECO spare cell and the candidate cell.

FIG. 5 shows a block diagram of a computer system in which a preferred embodiment may be implemented.

DETAILED DESCRIPTION OF THE PREFERRED EMBODIMENT

The present invention is described with reference to the Figures.

FIG. 1 shows a an example of an integrated circuit chip in which the present invention can be implemented. This diagram shows a top view of an IC chip 100. In this example, an ECO design adds a logic element to an existing logic path. The preferred location 102 of this added logic element is shown by an "X". The diagram shows a radius R 104 centered on the preferred location 102. Radius 104 can vary depending on the timing margins associated with the various paths. If timing margins are generally narrow, a smaller radius could be used to weed out candidates likely to end in timing closure failure. Example radii can be on the order of 200 microns, but depends ultimately on the exact implementation. Also shown is an extra or spare logic cell 106 that is located at a relatively large distance from the preferred location 102.

In this example embodiment, the ECO specifies an added logic element to an existing logic path. In non-innovative systems, the spare cell 106 would be used as the added element. However, the added element (i.e., the spare cell 106 in this case) must be connected to the existing logic path, which requires fabrication of an interconnect 108 between the spare cell 106 and the existing path. The distance between the spare cell and the preferred location 102 means timing delays will be introduced, as well as degraded signal integrity.

Instead, the present invention searches for nearby logic paths with candidate logic cells 110. The candidate cells 110 are those cells which could fulfill the ECO if they connected to the logic path to be changed. Candidate cells are preferably identified within radius 104. The relative proximity of the candidate cell and the preferred location 102 means less timing delay will be introduced.

Hence, instead of connecting the spare cell 106 to the ECO path which is to be changed, one of the candidate cells from a (preferably nearby) donor logic path is used. To replace the used candidate cell in the donor path, the spare cell is connected to the donor path in place of the donated candidate cell.

Of course, not all donor paths will be timing closed with the spare cell. Static timing analysis is performed to make sure all logic paths end up timing closed, as described more fully below.

FIG. 2 shows a process flow for implementing a preferred embodiment of the present invention. It should be noted that this is only one example implementation, and other processes using the present innovative concepts are also possible. First, the ECO logic changes are implemented (step 202). In this step, the combinational and/or sequential logic elements (e.g., AND gate, OR gate, D flip-flop, etc.) are added to the existing placed logic path. Existing extra placed or spare cells are used for this step. The physical designer then implements the ECO logic change. After the ECO implementation, the physical designer provides a new netlist and new standard delay format (SDF) file in order for static timing analysis (STA) to be run. The netlist describes the connectivity between each logic cell in the design, while the SDF file is a timing annotated file describing the delay between given elements or paths.

Next, the STA is performed (step 204) to ensure that the logic elements added don't negatively affect the timing slack of the ECO logic path. If the STA reports a negative (i.e., falling) slack, added measures are employed. If the STA reports a positive (i.e., passing) slack, the path can be left as is and the path is considered timing closed.

If in step 204 the STA reports negative slack, then candidate cells in donor logic paths are found in the local vicinity of the ECO affected logic (step 206). The physical designer provides a Physical Design Exchange Format (PDEF) file that contains the physical location of each logic element found in the layout. This PDF file is used to find candidate logic cells in the area near the ECO logic path. For example, if a 2 input AND gate needs to be added to the ECO logic path, and the timing effect of using an extra AND cell is too large (e.g., it is far enough away to cause timing closure failure), an equivalent AND gate will be found within a specified radius of the ECO logic path. The equivalent AND gates in the donor logic paths are termed candidate cells. In a preferred embodiment, the PDEF is parsed for all needed cell types within the preferred radius. The decision as to which candidate cell to implement into the ECO path is preferably determined by looking at both the distance between the candidate and the preferred location and the resulting timing analysis.

Once all the candidate cells within the specified radius of the ECO logic path are located, STA is run on each of the donor logic paths that includes a candidate cell (step 208). The purpose of this step is to ensure that all logic paths through the candidate cells have excess timing margin that will allow the candidate cells to be exchanged with the ECO extra cell. As described above, the extra cell is usually found in a non-ideal location of the die layout, such as far from the ECO path. If the candidate cell has sufficient excess passing timing margin in its parent logic tree, then the candidate cell can be exchanged with the extra cell used in the ECO logic path (step 210). In other words, the non-critical timing path in the donor logic path can afford to use the non-ideally placed ECO extra cell since sufficient excess timing margin exists that offsets the reduction in timing margin associated with the interconnect routing to the extra cell. The critical timing path in the ECO logic path can thus be improved using the more ideally placed candidate cells from the donor logic paths.

Next, the physical designer implements the ECO logic change which swaps the extra cell in the ECO logic path with the candidate cells in the donor logic path. After the ECO implementation, the physical designer provides a new netlist and new Standard Delay Format (SDF) file in order to run STA again.

STA is then performed on both the altered ECO logic path that now uses the candidate cell and the altered donor logic path that now uses the extra cell (step 212). If passing timing closure is achieved, the process completes (step 216). If one of the paths did not achieve a passing (i.e., positive) timing slack, extra measures are taken. If the ECO logic path did not meet timing, iterate again (e.g., using another candidate cell) or rework the ECO logic solution (step 214). If the donor logic path with the exchanged extra cell does not meet timing closure, the same iteration described above starting with step 206 is performed on the now failing donor logic path. Scripts or programs can be developed to help automate the system.

FIG. 3 shows the initial placement of the ECO extra cell 302 in the ECO logic path and the candidate cell 304 in the donor logic path. This figure shows the connections made to include the extra cell 302 into the ECO path, leaving the candidate cell 304 connected to its donor logic path.

FIG. 4 shows the same system after implementation of the present invention. The extra cell 302 is now connected to the donor logic path in place of the donated candidate cell 304. Candidate cell 304 is now shown connected to the ECO logic path. In this figure, the boxed letters A, B, and Z represent connection to their counterpart boxed letters.

Although FIG. 3 and FIG. 4 show the D flip-flops (FF0, FF1, FF2, FF3, FF4, FF5) having a common clock source, the D flip-flops can use more than one clock source.

FIG. 5 shows a block diagram of a typical computer system in which steps of the present invention may be implemented. Many of the steps of the present invention are capable of being implemented with a computer. For example, the steps demonstrated in FIG. 2 such as implementing logic changes into a circuit, static timing analysis, identifying candidate logic cells or elements, and exchange of logic elements in a design can all be implemented either partially or completely using a computer system.

FIG. 5 shows a block diagram of a data processing system is shown in which the present invention may be implemented. Data processing system 500 is an example of a computer in which code or instructions implementing the processes of the present invention may be located. Data processing system 500 employs a peripheral component interconnect (PCI) local bus architecture. Although the depicted example employs a PCI bus, other bus architectures such as Accelerated Graphics Port (AGP) and Industry Standard Architecture (ISA) may be used. Processor 502 and main memory 504 are connected to PCI local bus 506 through PCI bridge 508. PCI bridge 508 also may include an integrated memory controller and cache memory for processor 502. Additional connections to PCI local bus 506 may be made through direct component interconnection or through add-in boards. In the depicted example, local area network (LAN) adapter 510, small computer system interface SCSI host bus adapter 512, and expansion bus interface 514 are connected to PCI local bus 506 by direct component connection. In contrast, audio adapter 516, graphics adapter 518, and audio/video adapter 519 are connected to PCI local bus 506 by add-in boards inserted into expansion slots. Expansion bus interface 514 provides a connection for a keyboard and mouse adapter 520, modem 522, and additional memory 524. SCSI host bus adapter 512 provides a connection for hard disk drive 526, tape drive 528, and CD-ROM drive 530. Typical PCI local bus implementations will support three or four PCI expansion slots or add-in connectors.

An operating system runs on processor 502 and is used to coordinate and provide control of various components within data processing system 500 in FIG. 5. The operating system may be a commercially available operating system such as Windows 2000, which is available from Microsoft Corporation. An object oriented programming system such as Java may run in conjunction with the operating system and provides calls to the operating system from Java programs or applications executing on data processing system 500. "Java" is a trademark of Sun Microsystems, Inc. Instructions for the operating system, the object-oriented programming system, and applications or programs are located on storage devices, such as hard disk drive 526, and may be loaded into main memory 504 for execution by processor 502.

Those of ordinary skill in the art will appreciate that the hardware in FIG. 5 may vary depending on the implementation. Other internal hardware or peripheral devices, such as flash ROM (or equivalent nonvolatile memory) or optical disk drives and the like, may be used in addition to or in place of the hardware depicted in FIG. 5. Also, the processes of the present invention may be applied to a multiprocessor data processing system.

For example, data processing system 500, if optionally configured as a network computer, may not include SCSI host bus adapter 512, hard disk drive 526, tape drive 528, and CD-ROM 530, as noted by dotted line 532 in FIG. 5 denoting optional inclusion. In that case, the computer, to be properly called a client computer, must include some type of network communication interface, such as LAN adapter 510, modem 522, or the like. As another example, data processing system 500 may be a stand-alone system configured to be bootable without relying on some type of network communication interface, whether or not data processing system 500 comprises some type of network communication interface. As a further example, data processing system 500 may be a personal digital assistant (PDA), which is configured with ROM and/or flash ROM to provide non-volatile memory for storing operating system files and/or user-generated data.

The depicted example in FIG. 5 and above-described examples are not meant to imply architectural limitations. For example, data processing system 500 also may be a notebook computer or hand held computer in addition to taking the form of a PDA. Data processing system 500 also may be a kiosk or a Web appliance. The processes of the present invention are performed by processor 502 using computer implemented instructions, which may be located in a memory such as, for example, main memory 504, memory 524, or in one or more peripheral devices 526–530.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system for implementing logic changes, comprising:
a first logic path in an integrated circuit;
a donor logic path in the integrated circuit having candidate logic;
spare logic in the integrated circuit;
wherein the candidate logic is disconnected from the donor logic path and is connected to the first logic path; and
wherein the spare logic is connected to the donor logic path in place of the candidate logic.

2. The system of claim 1, wherein the candidate logic is a combinational and/or sequential logic element, and wherein the spare logic is an equivalent logic element.

3. The system of claim 1, wherein the candidate logic is part of a set of multiple candidate logic elements, the set of multiple candidate logic elements all being within a radius of a preferred location, wherein the placement of spare logic at the preferred location would cause minimal timing concerns.

4. The system of claim 1, wherein the candidate logic comprises a plurality of logic elements.

5. A method for implementing logic changes, comprising the steps of:
identifying a candidate cell in a first logic path;
disconnecting the candidate cell from the first logic path;
connecting the candidate cell to a second logic path; and
connecting a spare cell to the first logic path.

6. The method of claim 5, wherein the candidate cell is within 200 microns of a preferred location, wherein the placement of spare logic at the preferred location would cause minimal timing concerns.

7. The method of claim 5, wherein the step of identifying a candidate cell only happens if a static timing analysis of the second logic path indicates failed timing closure.

8. The method of claim 5, wherein the logic path is a placed logic path, and wherein the logic elements added are existing spare logic elements.

9. A method for designing and implementing logic changes, comprising the steps of:
designing a first logic path having a first logic element;
determining whether the first logic path having the first logic element is timing closed;
if the first logic path having the first logic element is not timing closed, identifying a second logic path having a candidate logic element;
disconnecting the candidate logic element from the second logic path;
designing the first logic path having the candidate logic element in place of the first logic element;
designing the second logic path having a third logic element in place of the candidate logic element;
determining whether the first logic path having the candidate logic element is timing closed; and
determining whether the second logic path having the third logic element is timing closed.

10. The method of claim 9, wherein the first logic element is a spare logic element.

11. The method of claim 9, wherein the second logic path has excess passing timing lack.

12. The method of claim 9, wherein the step of identifying includes determining timing closure margin on the second logic path.

13. The method of claim 9, wherein the first logic element and the third logic element are the same logic element.

14. A system for implementing logic changes, comprising:
means for identifying a candidate cell in a first logic path;
means for disconnecting the candidate cell from the first logic path;

means for connecting the candidate cell to a second logic path; and means for connecting a spare cell to the first logic path.

15. The system of claim 14, wherein the candidate cell is within 200 microns of a preferred location, wherein the placement of spare logic at the preferred location would cause minimal timing concerns.

16. The system of claim 14, wherein the means for identifying the candidate cell in the first logic path include determining excess timing closure margin for the first logic path.

17. A method for implementing logic changes, comprising the steps of:

identifying a plurality of donor logic paths, each donor logic path of the plurality having a candidate logic cell;

performing timing analysis on the plurality of donor logic paths;

identifying first donor logic path of the plurality having excess timing closure margin;

disconnecting the candidate logic cell of the first donor logic path from the first donor logic path;

connecting the candidate logic cell of the first logic path to a second logic path; and connecting a spare logic cell to the first donor logic path in place of the candidate logic cell of the first donor logic path.

18. A computer program product for implementing logic changes in a logic path, comprising the computer implemented steps of:

first instructions for identifying a plurality of donor logic paths, each donor logic path of the plurality having a candidate logic cell;

second instructions for performing timing analysis on the plurality of donor logic paths;

third instructions for identifying a first donor logic path of the plurality having excess timing closure margin;

fourth instructions for redesigning the logic path wherein the candidate logic cell of the first donor logic path is disconnected from the first donor logic path and the candidate logic ell of the first donor logic path is connected to the logic path; and fifth instructions for connecting a spare logic cell to the first donor logic path in place of the candidate logic cell of the first donor logic path.

* * * * *